US010861567B2

(12) United States Patent
Rowley et al.

(10) Patent No.: US 10,861,567 B2
(45) Date of Patent: Dec. 8, 2020

(54) CAPACITIVE VOLTAGE MODIFIER FOR POWER MANAGEMENT

(71) Applicant: Micron Technology, Inc., Boise, ID (US)

(72) Inventors: Matthew D. Rowley, Boise, ID (US); Dustin J. Carter, Placerville, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/684,924

(22) Filed: Nov. 15, 2019

(65) Prior Publication Data

US 2020/0090765 A1 Mar. 19, 2020

Related U.S. Application Data

(63) Continuation of application No. 16/119,715, filed on Aug. 31, 2018, now Pat. No. 10,482,979.

(51) Int. Cl.
*G11C 5/14* (2006.01)
*G11C 16/30* (2006.01)
(Continued)

(52) U.S. Cl.
CPC ........ *G11C 16/30* (2013.01); *G01R 19/16552* (2013.01); *G05F 1/462* (2013.01);
(Continued)

(58) Field of Classification Search
CPC ......... G11C 16/30; G11C 5/145; G11C 5/147; G01R 19/16522; G05F 1/462; G06F 1/28
(Continued)

(56) References Cited

U.S. PATENT DOCUMENTS

| 4,752,699 A | 6/1988 | Cranford |
| 5,909,141 A | 1/1999 | Tomishima |

(Continued)

FOREIGN PATENT DOCUMENTS

| CN | 101329899 B | 6/2012 |
| JP | 10247386 A | 9/1998 |

(Continued)

OTHER PUBLICATIONS

International Search Report and Written Opinion from related international application No. PCT/2019/048780, dated Dec. 19, 2019, 10 pages.

(Continued)

*Primary Examiner* — Xiaochun L Chen
(74) *Attorney, Agent, or Firm* — Brooks, Cameron & Huebsch, PLLC

(57) ABSTRACT

A memory sub-system includes a power management integrated circuit (PMIC) compatible with operation at an uppermost PMIC supply voltage that is lower than a primary supply voltage of the memory sub-system. The PMIC is configured to output multiple voltages for operation of the memory sub-system based on a PMIC supply voltage. The memory sub-system further includes a capacitive voltage modifier (CVM) coupled to the PMIC. The CVM is configured to receive the primary supply voltage of the memory sub-system as an input and provide a first modified primary supply voltage (MPSV) to the PMIC as the PMIC supply voltage, where the first MPSV is not higher than the uppermost PMIC supply voltage.

22 Claims, 5 Drawing Sheets

(51) Int. Cl.
    *G06F 1/26*        (2006.01)
    *G05F 1/46*        (2006.01)
    *G06F 1/28*        (2006.01)
    *G01R 19/165*    (2006.01)
    *G11C 16/10*      (2006.01)
    *H02M 3/158*     (2006.01)

(52) U.S. Cl.
    CPC ............... *G06F 1/263* (2013.01); *G06F 1/28* (2013.01); *G11C 5/145* (2013.01); *G11C 5/147* (2013.01); *G11C 16/10* (2013.01); *H02M 3/1582* (2013.01)

(58) Field of Classification Search
    USPC .................................................... 365/185.21
    See application file for complete search history.

(56) References Cited

U.S. PATENT DOCUMENTS

| | | | |
|---|---|---|---|
| 6,003,139 | A | 12/1999 | McKenzie |
| 6,269,025 | B1 | 7/2001 | Hollmer et al. |
| 6,392,944 | B1 * | 5/2002 | Kono .................. G11C 7/12 327/51 |
| 6,515,903 | B1 | 2/2003 | Le |
| 7,245,536 | B1 | 7/2007 | Poenaru |
| 7,789,312 | B2 | 9/2010 | Rhelimi |
| 7,818,599 | B2 | 10/2010 | Haridass |
| 8,222,881 | B2 | 7/2012 | Ivanov et al. |
| 8,542,059 | B2 | 9/2013 | Tejada |
| 9,536,805 | B2 | 1/2017 | Fazelpour et al. |
| 9,588,915 | B2 | 3/2017 | Yu |
| 9,753,470 | B1 | 9/2017 | Hawley et al. |
| 9,929,130 | B2 | 3/2018 | Kent |
| 9,973,431 | B2 | 5/2018 | Mishra et al. |
| 10,482,979 | B1 | 11/2019 | Rowley |
| 2003/0112691 | A1 | 10/2003 | Sundaram |
| 2005/0201179 | A1 | 9/2005 | Simko |
| 2008/0203991 | A1 | 8/2008 | Williams |
| 2009/0091378 | A1 | 4/2009 | Haridass |
| 2012/0026802 | A1 | 2/2012 | Confalonieri |
| 2013/0107640 | A1 | 5/2013 | Yamada |
| 2014/0347946 | A1 | 11/2014 | Plavec |
| 2015/0228328 | A1 | 8/2015 | Cordero et al. |
| 2016/0111134 | A1 | 4/2016 | Kim |
| 2017/0062056 | A1 | 3/2017 | Park et al. |
| 2017/0099011 | A1 | 4/2017 | Freeman |
| 2017/0300077 | A1 | 10/2017 | Hsu et al. |
| 2018/0101711 | A1 | 4/2018 | D'Souza et al. |

FOREIGN PATENT DOCUMENTS

| | | |
|---|---|---|
| JP | 2001184884 A | 7/2001 |
| JP | 201501186 A | 11/2015 |
| KR | 10-2009-0046340 A | 5/2009 |
| KR | 1020140111896 A | 9/2014 |
| TW | I498915 | 9/2015 |
| WO | 2018148218 A1 | 8/2018 |

OTHER PUBLICATIONS

International Search Report and Written Opinion from related international application No. PCT/2019/047622, dated Dec. 5, 2019, 10 pages.

Office Action and Search Report from related Taiwan patent application No. 108131229, dated Apr. 1, 2020, 18 pages.

Office Action and Search Report from related Taiwan patent application No. 108131366, dated Jun. 1, 2020, 13 pages.

* cited by examiner

440 ─┐

┌──────────────────────────────────────────────────────────────┐
│ OUTPUTTING A BACKUP VOLTAGE FROM A BACKUP POWER COMPONENT (BPC) │─ 441
│ TO A CAPACITIVE VOLTAGE MODIFIER (CVM) RESPONSIVE │
│ TO DETECTION OF A REDUCED PRIMARY SUPPLY VOLTAGE │
└──────────────────────────────────────────────────────────────┘

┌──────────────────────────────────────────────────────────────┐
│ PERFORMING, BY THE CVM, A COARSE ADJUSTMENT ON THE BACKUP VOLTAGE │
│ TO CAUSE A REDUCED BACKUP VOLTAGE TO BE WITHIN │─ 442
│ A PREDETERMINED RANGE OF VOLTAGES COMPATIBLE WITH │
│ OPERATION OF A POWER MANAGEMENT INTEGRATED CIRCUIT (PMIC) │
└──────────────────────────────────────────────────────────────┘

┌──────────────────────────────────────────────────────────────┐
│ PERFORMING, BY THE PMIC, A FINE ADJUSTMENT ON THE REDUCED │
│ BACKUP VOLTAGE RECEIVED FROM THE CVM TO CAUSE A FURTHER │
│ REDUCED VOLTAGE TO BE WITHIN A PREDETERMINED RANGE OF │─ 443
│ VOLTAGES COMPATIBLE WITH PERFORMANCE OF AN OPERATION ON │
│ A SELECTED ARRAY OF MEMORY CELLS ON A SOLID-STATE DRIVE (SSD) │
└──────────────────────────────────────────────────────────────┘

┌──────────────────────────────────────────────────────────────┐
│ WHERE PERFORMING THE COARSE ADJUSTMENT INCLUDES THE │
│ PREDETERMINED RANGE OF VOLTAGES COMPATIBLE WITH OPERATION │
│ OF THE PMIC BEING WIDER THAN THE PREDETERMINED RANGE OF │─ 444
│ VOLTAGES COMPATIBLE WITH OPERATION OF THE SELECTED ARRAY │
│ THAT IS CAUSED BY THE FINE ADJUSTMENT │
└──────────────────────────────────────────────────────────────┘

┌──────────────────────────────────────────────────────────────┐
│ WHERE PERFORMING THE FINE ADJUSTMENT INCLUDES THE VALUES │
│ OF THE FURTHER REDUCED VOLTAGES THAT ARE COMPATIBLE WITH │
│ PERFORMANCE OF THE NUMBER OF OPERATIONS ON THE SELECTED ARRAY │─ 445
│ BEING LESS THAN THE VALUES OF THE REDUCED BACKUP VOLTAGES │
│ THAT ARE COMPATIBLE WITH OPERATION OF THE PMIC │
└──────────────────────────────────────────────────────────────┘

*FIG. 4*

CAPACITIVE VOLTAGE MODIFIER FOR POWER MANAGEMENT

PRIORITY INFORMATION

This application is a Continuation of U.S. application Ser. No. 16/119,715, filed Aug. 31, 2018, the contents of which are incorporated herein by reference.

TECHNICAL FIELD

The present disclosure relates generally to memory sub-systems, and more particularly, to a capacitive voltage modifier for power management for a memory sub-system.

BACKGROUND

A memory sub-system can be a storage system, such as a solid-state drive (SSD), and can include one or more memory components that store data. The memory components can, for example, include volatile memory components and non-volatile memory components. The memory sub-system can include a controller that can manage the memory components and allocate data to be stored at the memory components. In general, a host system may utilize a memory sub-system to store data at the memory components and to retrieve data from the memory components via the controller. Various memory sub-systems include a power management component to manage power allocation.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is an additional flow diagram of the example method illustrated in FIG. 3 in accordance with some embodiments of the present disclosure.

DETAILED DESCRIPTION

Figure 1:
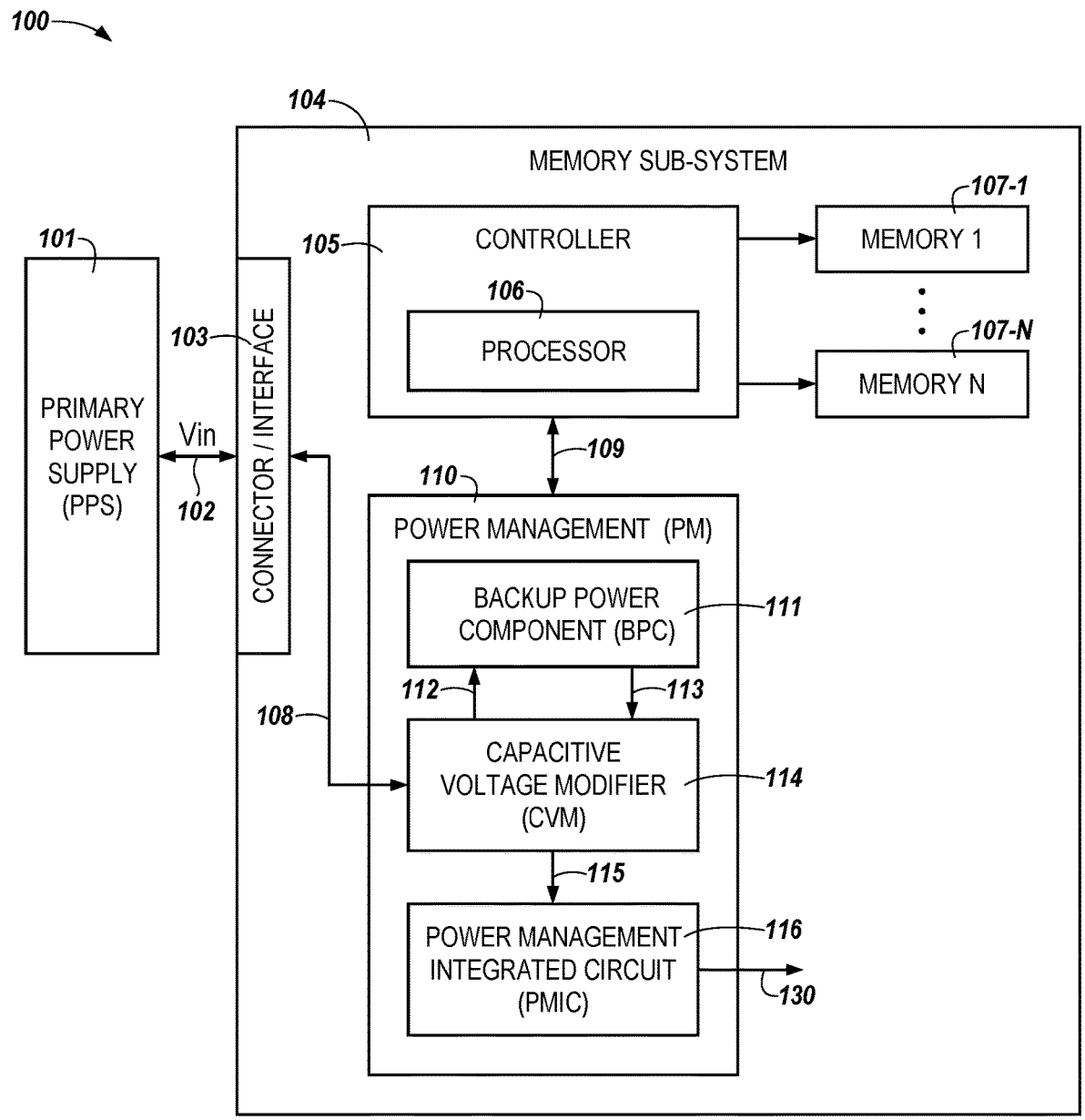
FIG. 1 illustrates an example computing environment that includes a memory sub-system in accordance with some embodiments of the present disclosure.

Aspects of the present disclosure are directed to a capacitive voltage modifier (CVM) for power management in a memory sub-system. A memory sub-system is also hereinafter referred to as a "memory device." An example of a memory sub-system is a storage system, such as a solid-state drive (SSD). Various memory sub-systems can include a power management (PM) component to manage receipt of a primary supply voltage from an electrical power source and to appropriately allocate electrical power (e.g., magnitudes of voltages) so as to be compatible with operation of one or more memory components of a particular memory sub-system. The PM component can include a backup power component (BPC) to supply electrical power to the memory sub-system when electrical power from the source is interrupted and/or is below a threshold magnitude. The PM component also can include a power management integrated circuit (PMIC).

Some conventional PMIC components can include etched or hard-coded logic to provide control over the various requirements of a memory device. In approaches that utilize etched or hard-coded logic, the PMIC component can be configured to provide control over the various requirements of a particular memory device. As a result, such conventional PMIC components can only be used for a particular application and/or for a particular memory device. If the requirements of the memory device change, for example, such conventional PMIC components can cease to function or operate properly, which can result in stockpiles of conventional PMIC components becoming obsolete and therefore non-fungible.

In order to reduce wasted stockpiles of PMIC components that are etched or include hard-coded logic, some conventional PMIC components employ eFuses, which can allow for aspects of the PMIC component to be changed after manufacture. In PMIC components that employ eFuses, if a particular PMIC component is no longer used or needed, for example due to changes in various requirements of a memory device for which the PMIC component is designed, one or more of the eFuses may be burned (e.g., blown). This may allow for the PMIC component to be reprogrammed to a certain extent to function with a memory device that has had its various requirements changed after manufacture of the PMIC component. However, due to the nature of eFuses (e.g., when an eFuse has been blown it cannot be blown again), conventional PMIC components that utilize eFuses can only be reprogrammed a finite number of times.

Further, conventional PMIC components that use eFuses are often programmed (e.g., the eFuses are blown) after manufacture and/or prior to a point of sale to operate in accordance with a particular set of memory device requirements. If the memory device requirements change after the eFuses are blown, the conventional PMIC component can generally not be reprogrammed, which can result in the stockpiles of conventional PMIC components becoming obsolete and therefore non-fungible. Accordingly, similar to conventional approaches in which PMIC components are etched or hard-coded, conventional approaches to PMIC components that utilize eFuses can lead to wasted stockpiles of PMIC components. For example, because of the single use nature of eFuses, when the requirements of a memory device for which the PMIC component is designed change, PMIC components that utilize eFuses can become non-fungible.

A conventional PMIC can be configured to convert the primary supply voltage of a memory device to various output voltages (e.g., rails) for operation of the memory components. However, various conventional PMICs are configured to operate at a particular supply voltage, or within a limited range of supply voltages. Accordingly, different conventional PMICs, which are not designed to operate at other primary supply voltages, are designed to accommodate different primary supply voltages in order to, for example, avoid damage to constituent components of the PMIC. In conventional implementations, a PMIC can receive a primary supply voltage at, for example, 12 volts (V) and can reduce the primary supply voltage in a single operation using a voltage converter (e.g., a buck regulator, among other possible types of regulators on the PMIC). A voltage converter configured to perform a large voltage reduction (e.g., from 12V to 1V) uses more energy than a voltage converter configured to perform a smaller voltage reduction (e.g., from 4V to 1V). In addition, such a voltage converter can occupy more area and/or volume (e.g., on a circuit board) than a voltage converter configured to perform a smaller voltage reduction.

Moreover, a reduction of a magnitude of the primary supply voltage (e.g., below a threshold voltage) can result in loss of data from memory components (e.g., an array of memory cells) in conventional implementations. For example, interruption of a connection of a memory device to a primary power supply can result in loss of data from an array of volatile memory cells upon which data is stored and/or upon which various operations are being performed, among other possible consequences of reduction of the primary supply voltage.

Aspects of the present disclosure address the above, and other deficiencies, by providing the CVM, as described herein, as part of the PM component. Including the CVM between an input of the primary supply voltage and the PMIC configured to be compatible with operating at a lower voltage than the primary supply voltage can address the above, and other, deficiencies of a conventional PMIC implementation. For example, the CVM can convert a primary supply voltage of 12V or higher to a PMIC supply voltage in a range of 3-5V that is compatible with operation of the PMIC. The CVM can be configured to accommodate multiple different primary supply voltages by converting the multiple different primary supply voltages into a supply voltage (e.g., within a limited range of supply voltages) compatible with operation of a particular PMIC. The CVM of the PM component can be configured to store multiple configuration profiles, as described further herein, that can be dynamically selected based on various requirements resulting from changes to a magnitude of the primary supply voltages input from a primary power supply to the memory sub-system via the CVM.

A two-stage implementation of the CVM configured as such, along with using the PMIC to further adjust the PMIC supply voltage to voltages compatible with operation of memory components of the memory sub-system, can provide improved energy efficiencies. Such an improved energy efficiency can be above energy efficiencies achieved with conventional one-stage reductions using a single voltage converter (e.g., a buck regulator) or conventional two-stage reductions using two such voltage converters for such a large voltage reduction. Moreover, fewer voltage converters and/or a voltage converter configured to perform a smaller voltage reduction than a voltage converter configured to perform a larger voltage reduction (e.g., a voltage converter that performs a 4V to 1V rather than 12V to 1V reduction) can occupy less area and/or volume (e.g., within a PMIC on a circuit board). A CVM combined with a PMIC, which is configured to operate at a voltage output from the CVM, also can cost less than a conventional PMIC that is configured to operate at, for example, 12V and produce an output voltage of 1V.

FIG. 1 illustrates an example computing environment 100 that includes a memory sub-system 104 in accordance with some embodiments of the present disclosure. The computing environment 100 illustrated in FIG. 1 shows various components that are part of, or that are coupled to, the memory sub-system 104. For example, a primary power supply (PPS) 101 can be coupled to the memory sub-system 104. As used herein, "coupled to" generally refers to a connection between components, which can be an indirect communicative connection or direct communicative connection (e.g., without intervening components), whether wired or wireless, including connections such as electrical, optical, magnetic, etc.

The memory sub-system 104 can include a PM component 110. The PM component 110 can, in various embodiments, include a CVM 114, a BPC 111, and a PMIC 116. The memory sub-system 104 can include the PM component 110 coupled to a memory device controller 105 (hereinafter referred to as "controller").

The PM component 110 on memory sub-system 104 can include a PMIC 116 configured to adjust a particular input voltage so as to be compatible with operation of various components of memory sub-system 104. The PMIC 116 can be compatible with operation at an uppermost PMIC supply voltage. The PMIC supply voltage is lower than a primary supply voltage 102 of the memory sub-system 104. The primary supply voltage 102 provided by the PPS 101. The PMIC 116 can be configured to output one or more voltages for operation of the memory sub-system 104 based on a PMIC supply voltage. The voltages to be output can, in a number of embodiments, be determined based on conversion of the PMIC supply voltage to one or more reduced voltages corresponding to voltages compatible with operation of one or more components of memory sub-system 104, which can include controller 105, memory components 107-1, . . . , 107-N, and/or circuitry associated therewith, such as control circuitry, input/output (I/O) circuitry, address circuitry, etc.

As used herein, stating that a voltage is "compatible with" operation of a particular component is intended to mean that supplying a higher voltage can inactivate (e.g., rupture, burn out, etc.) a fuse, a transistor, a capacitor, etc., of a component configured to operate in a lower voltage range or that supplying a lower voltage can be below a voltage threshold for operation of the component. For example, the primary supply voltage 102 can be 12V or higher and a voltage compatible with operation of the PMIC 116 and/or the components thereof can be around 4V. If a primary supply voltage of 12V or higher, for example, were input to a component compatible with operation at an uppermost voltage of 5V, such a component may be inactivated. Reduction of such a high primary supply voltage to 4V, for example, can contribute to reducing a probability of such inactivation.

The PM component 110 can include a CVM 114 coupled to the PMIC 116. The CVM 114 can be utilized for modifying (e.g., reducing and/or increasing) the primary supply voltage 102 and/or a voltage supplied to and/or by the BPC 111, as described herein. The CVM 114 can be coupled to connector/interface 103. The connector/interface 103 can be utilized for input of the primary supply voltage 102 ($V_{in}$) from the PPS 101 and/or for output of signals to control output of the primary supply voltage 102 from the PPS 101.

The CVM 114 can be configured to receive the primary supply voltage 102 as $V_{in}$ and provide a first modified primary supply voltage (MPSV) 115 to the PMIC 116 as the PMIC supply voltage. The primary supply voltage 102 can, in a number of embodiments, be received via the connector/interface 103 from the PPS 101 of the memory sub-system 104. The first MPSV 115 can be a voltage that has been converted by the CVM 114 from the primary supply voltage 102 to a voltage that is not higher than the uppermost PMIC supply voltage at which the PMIC 116 is configured to operate (e.g., a voltage within a range of 3-5V).

The CVM 114 can be configured to receive, as input, multiple different primary supply voltages that are higher than the uppermost PMIC supply voltage. For example, the primary supply voltages can range from being greater than the uppermost PMIC supply voltage (e.g., 5V) to being 240V or more at various times during operation of the memory sub-system 104. Such fluctuations in the primary supply voltage can result from various causes, such as, intended inputs of increased electrical power to the PPS 101 for performance of particular operations, unintended input and/or unregulated input of electrical power to the PPS 101, and/or inappropriate operation of the PPS 101 (e.g., contributed to by damaged and/or inoperable components thereof), among other causes.

The CVM 114 can be configured to reduce each of the different primary supply voltages when they are provided by the PPS 101 through the connector/interface 103 to provide the first MPSV 115 to the PMIC 116 as the PMIC supply voltage compatible with operation of the PMIC 116. The CVM 114 can be configured to divide the different primary supply voltages to produce the first MPSV 115 such that the first MPSV 115 can be selectably determined to provide the PMIC supply voltage compatible with operation of the PMIC 116. For example, at the different times when each of the different primary supply voltages they are provided by the PPS 101 to the CVM 114, the CVM 114 can be configured to appropriately reduce the different primary supply voltages so as to be compatible with operation of the PMIC 116, and other memory components, by adjusting the connections of multiple capacitors included on the CVM 114, as described herein.

The multiple capacitors of the CVM 114 can be adjustably (e.g., selectably) configured into multiple configurations. Producing the first MPSV 115 can be performed by selectably connecting multiple capacitors of the CVM 114 in the multiple configurations. For example, the CVM 114 can be configured to selectably adjust (e.g., reduce) the primary supply voltage 102 to the first MPSV 115 via multiple series-coupled capacitors being selectably connected. The configuration of the connections and/or how many of the multiple capacitors are selectably connected can depend on how high the primary supply voltage 102 is and/or an amount that the primary supply voltage 102 is to be reduced to be compatible with operation of the PMIC 116 and/or the BPC 111. For example, capacitors connected (coupled) in series can be utilized for reduction of the primary supply voltage 102 to a first MPSV 115 compatible with operation of the PMIC 116 in order to be output to the PMIC 116. In contrast, capacitors connected (coupled) in parallel can be utilized to amplify the primary supply voltage 102 to a second MPSV 112 compatible with charging the BPC 111 in order to be output to the BPC 111.

Figure 2:
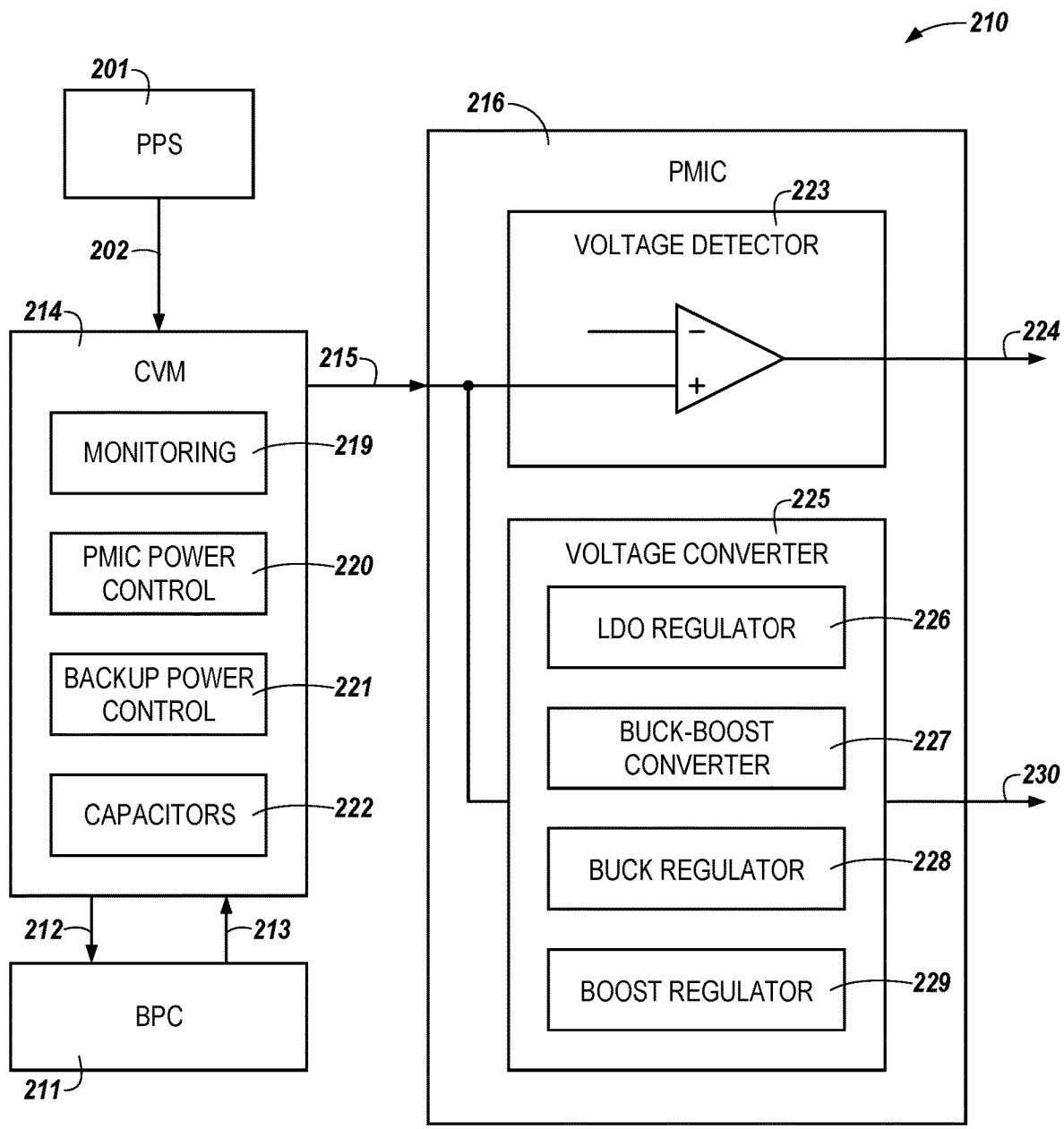
FIG. 2 illustrates an example of a power management component in accordance with some embodiments of the present disclosure.

Based on whether a modified power supply voltage is to be provided to the PMIC 116 or the BPC 111, control circuitry of the CVM 114 can, for example, include a PMIC power control component shown at 220 and a backup power control component shown at 221 in FIG. 2 configured to determine the appropriate connections of the multiple capacitors to enable the appropriate output of the first MPSV 115 to the PMIC 116 and the appropriate connections of the multiple capacitors to enable the appropriate output of the second MPSV 112 to the BPC 111.

The PMIC 116 can include multiple regulators operable as a voltage converter component, described in greater detail in connection with FIG. 2. The PMIC 116 can be configured to convert the first MPSV 115 received from the CVM 114 to multiple voltages, for operation of various components of the memory sub-system 104, to be output from the PMIC 116. The multiple regulators of the PMIC 116 can, in a number of embodiments, include a first regulator configured to reduce the first MPSV 115 received from the CVM 114 to one or more voltages compatible with operation of memory components 107. For example, the PMIC 116 can be configured to reduce the first MPSV 115 to a reduced voltage compatible with operation of an array of memory cells of the memory sub-system 104 and the reduced voltage can be selectably output from the PMIC 116 for operation of the array. The PMIC 116 can, in a number of embodiments, include a second regulator configured to increase the first MPSV 115 received from the CVM 114 for operation of one or more components of the memory sub-system 104.

In some embodiments, the PM component 110 can include the BPC 111. The BPC 111 can be configured to operate as a backup power supply (BPS) of the memory sub-system 104. The BPC 111 can include various types of electrochemical energy storage devices and/or capacitive storage components (CSC), as described further herein, to provide the BPS to enable performance of a number of operations in the event of reduction of a magnitude of the primary supply voltage 102 below a threshold (e.g., when the PPS 101 is inoperable or otherwise does not output sufficient voltage).

The CVM 114 can, in a number of embodiments, be further configured to provide a second MPSV 112 to charge the BPC 111 configured to operate as the BPS of the memory sub-system 104. The BPC 111 can be configured to provide a backup voltage 113 to the CVM 114 to enable performance of the number of operations in the event of reduction of a magnitude of the primary supply voltage 102 below the threshold.

The CVM 114 can be configured to amplify the primary supply voltage 102, received via the connector/interface 103 from the PPS 101, to generate the second MPSV 112. The voltage level of the second MPSV 112 can be selectably determined based, at least partially, on a characteristic of the BPC 111. The second MPSV 112 can, in a number of embodiments, be increased from the primary supply voltage 102 such that the second MPSV 112 is not lower than the primary supply voltage 102 in order to, for example, be compatible with a storage capacity of the BPC 111 as one of the characteristics. Accordingly, an amplified voltage, corresponding to the second MPSV 112, can be selectably output from the CVM 114 to charge the BPC 111. For example, the CVM 114 can be configured to selectably adjust (e.g., amplify) the primary supply voltage 102 to produce the second MPSV 112 via multiple parallel-coupled capacitors being selectably connected.

The PMIC 116 of the present disclosure can include a voltage converter component. The voltage converter component can include, for example, a buck regulator, among other types of regulators, configured to operate on a first reduced voltage (e.g., the first MPSV 115) and to provide a second reduced voltage compatible with operation of the memory components. The second reduced voltage can be the further reduced voltage shown at 230 and described in connection with FIG. 2. For example, the primary supply voltage 102 can be 12V and the first MPSV 115 output from the CVM 114 for operation of the PMIC 116 can be 4V, and the voltage output from the PMIC 116 as the further reduced voltage 130 for operation of an array of memory cells can be around 1V. The CVM 114 can be configured to perform the first reduction in order to achieve the first MPSV 115 for output to the PMIC 116 using the CVM 114 as a capacitive voltage divider (CVD) having multiple (e.g., two or more) capacitors configured to, in a number of embodiments, be connected in a configuration to produce the first MPSV 115.

For example, the first MPSV 115 can be produced by selectably connecting the capacitors serially as a CVD to output one third (12÷3=4) of the primary supply voltage 102. The PMIC power control component 220 of the CVM 114 can be configured to determine the appropriate connections of the multiple capacitors, for a particular level of the primary supply voltage 102, to enable the appropriate output of the first MPSV 115 based on a signal (e.g., from controller 105) designating that a supply voltage is to be provided to the PMIC 116. As such, the CVD can be configured to scale (e.g., divide) the primary supply voltage 102 by a selectable ratio to provide the MPSV 115.

The CVM 114 can be configured to provide a second MPSV 112 to charge the BPC 111 configured to operate as the BPS for operation of the memory sub-system 104. The BPC 11 can, in a number of embodiments, be configured to store a voltage and have a storage capacity sufficient to supply sufficient voltage (V), current (amperage (A)), and/or power (1 watt (W)=1V×1 A), to enable performance of a number of operations in the event of reduction of a magnitude of the primary supply voltage 102 below a threshold. The BPC 111 can, in a number of embodiments, be one or more of various types of electrochemical energy storage devices (e.g., rechargeable batteries). Alternatively, as described further herein, the BPC can be a capacitive storage component (CSC) that can, in a number of embodiments, include one or more capacitors each configured to store a particular voltage and have a storage capacity sufficient to enable performance of the number of operations. The CVM 114 can be configured to operate as a capacitive voltage amplifier (CVA) to amplify the primary supply voltage 102 to produce the second MPSV 112 by the multiple capacitors being connected to output the second MPSV 112. For example, the multiple capacitors can be selectably connected in parallel to produce the second MPSV 112 to be output from the CVM 114 and received to charge the BPC 111 (e.g., the CSC and/or the rechargeable batteries).

The BPC 111 can be configured to function as the BPS in order to reduce (e.g., prevent) loss of data from the memory components in the event of the reduction of the primary supply voltage 102 below the threshold. A CSC of the BPC 111 can be configured to function as the BPS instead of, or in addition to, a conventional battery, among other possible uses for the CSC. For example, interruption of a connection of the memory device to, or inoperability of, the PPS 101 can result in the charged BPC 111 and/or CSC thereof providing electrical power (e.g., voltage and/or current) sufficient to move data stored on an array of memory cells on the memory sub-system 104. The data can be moved for storage by, in a number of embodiments, a non-volatile memory (NVM) array.

In a number of embodiments, memory sub-system 104 can include one or more memory components 107-1, ..., 107-N. Memory components 107-1, ..., 107-N can, in various embodiments, include any combination of different types of NVM components and/or volatile memory (VM) components. For example, the memory components can include at least one array of VM cells, at least one array of NVM cells, or at least one array of the VM cells in combination with at least one array of the NVM cells. In some embodiments, the memory sub-system 104 is a storage system. An example of a storage system is an SSD. The memory sub-system 104 can, in a number of embodiments, be an SSD or the memory sub-system 104 can be formed as part of an SSD. In some embodiments, the memory sub-system 104 is a hybrid memory/storage sub-system.

Each of the memory components 107-1, ..., 107-N can include one or more arrays of memory cells such as single level cells (SLCs) or multi-level cells (MLCs). The MLCs can, in a number of embodiments, include triple level cells (TLCs) and/or quad-level cells (QLCs). In some embodiments, a particular memory component can include both an SLC portion and an MLC portion of memory cells. Each of the memory cells can store one or more bits of data (e.g., data blocks).

An example of NVM components includes a negative-and (NAND) type flash memory. Although NVM components such as NAND type flash memory are described, the memory components 107-1, ..., 107-N can be based on various other types of memory, such as VM. In a number of embodiments, the memory components 107-1, ..., 107-N can be, but are not limited to, random access memory (RAM), read-only memory (ROM), dynamic random access memory (DRAM), synchronous dynamic random access memory (SDRAM), phase change memory (PCM), magneto random access memory (MRAM), NAND flash memory, negative-or (NOR) flash memory, electrically erasable programmable read-only memory (EEPROM), and a cross-point array of NVM cells. A cross-point array of NVM can perform bit storage based on a change of bulk resistance, in conjunction with a stackable cross-gridded data access array. Additionally, in contrast to many flash-based memories, cross-point NVM can perform a write in-place operation, where an NVM cell can be programmed without the NVM cell being previously erased. Furthermore, the memory cells of the memory components 107-1, ..., 107-N can be grouped as memory pages or data blocks that can refer to a unit of the memory component used to store data.

The PPS 101 can be an electrical power source that can supply the primary supply voltage 102 for input ($V_{in}$) to the memory sub-system 104 for operation of the PMIC 116 and/or the memory components 107-1, ..., 107-N, among other components of the memory sub-system 104. The PPS 101 can, for example, be an electrical outlet, a battery, and/or an AC/DC convertor, among other possible power sources. In a number of implementations, the primary supply voltage 102 can be higher than a voltage compatible with operation of the PMIC 116.

The controller 105 can communicate with the memory components 107-1, ..., 107-N to perform operations such as reading, writing, and/or erasing data at the memory components 107-1, ..., 107-N and other such operations. The controller 105 can include hardware such as one or more integrated circuits and/or discrete components, a buffer memory, or a combination thereof. The controller 105 can be a microcontroller, special purpose logic circuitry (e.g., a field programmable gate array (FPGA), an application specific integrated circuit (ASIC), etc.), or any other suitable processor. The controller 105 can include a processing device (e.g., processor 106) configured to execute instructions stored in local memory (not shown). The local memory of the controller 105 can include an embedded memory configured to store instructions for performing various processes, operations, logic flows, and/or routines that control operation of the memory sub-system 104, including handling communications between the memory sub-system 104 and a host (not shown). In some embodiments, the local memory can include memory registers storing memory pointers, fetched data, etc. The local memory also can include read-only memory (ROM) for storing micro-code.

While the example memory sub-system 104 shown in FIG. 1 has been illustrated as including the controller 105, in other embodiments of the present disclosure a memory sub-system 104 may not include a controller 105 and may instead rely upon external control. Such external control can, in a number of embodiments, be provided by an external host and/or by a processor or controller separate from the memory sub-system 104.

In general, the controller 105 can receive commands for operations from a host system (not shown and hereinafter referred to as a "host") and can convert the commands for operations into instructions or appropriate commands to achieve access to the memory components 107-1, ..., 107-N for performance of such operations. The controller 105 can be responsible for other operations such as wear leveling operations, garbage collection operations, error detection and error-correcting code (ECC) operations, encryption operations, caching operations, and/or address translations between a logical block address and a physical block address that are associated with the memory components 107-1, ..., 107-N. The controller 105 can communicate with the host via a physical host interface (e.g., connector/interface 103).

The memory sub-system 104 also can include additional circuitry or components that are not illustrated. The memory components 107-1, ..., 107-N can, in a number of embodiments, include control circuitry, address circuitry, sensing circuitry, and/or input/output (I/O) circuitry by which the memory components 107 can communicate with controller 105 and/or host. The control circuitry can, for example, include a PMIC power control component shown at 220 and a backup power control component shown at 221 in FIG. 2, among other control circuitry. The address circuitry can, for example, include row and column decode circuitry. As an example, in some embodiments, the address circuitry can receive an address from the controller 105 and decode the address to access the memory components 107-1, ..., 107-N. The sensing circuitry can include, for example, circuitry by which data values can be written at and/or read from a particular memory cell corresponding to an address in a row and/or column of an array. The further reduced voltage 130 output from the PMIC 116 for operation of the memory components 107-1, ..., 107-N (e.g., a number of arrays of memory cells) can, in a number of embodiments, be provided, as directed by the controller 105, to the memory components via designated circuitry (not shown).

In general, the computing environment 100 can include a host (not shown) that can utilize the memory sub-system 104 that includes the one or more memory components 107. In a number of embodiments, the PPS 101 can be on and/or be coupled to the host and/or the primary supply voltage 102 can come from the host. The host can provide data to be stored (written) at the memory sub-system 104 and/or can request data to be retrieved (read) from the memory sub-system 104. The memory sub-system 104 can include multiple interface connections (e.g., ports) to one or more hosts. A host can send data commands (e.g., read, write, erase, program, etc.) to the memory sub-system 104 via a port.

The host can be a computing device such as a desktop computer, laptop computer, network server, mobile device, or such computing device that includes a memory and a processing device. The host can include, or be coupled to, the memory sub-system 104 so that the host can read data from or write data to the memory sub-system 104. The host can be coupled to the memory sub-system 104 via a physical host interface (e.g., connector/interface 103). The physical host interface can include control, address, data bus components, etc., to provide an interface for passing control, address, data, and other signals between the memory sub-system 104 and the host. Examples of a physical host interface can include, but are not limited to, a serial advanced technology attachment (SATA) interface, a peripheral component interconnect express (PCIe) interface, universal serial bus (USB) interface, Fibre Channel, Serial Attached SCSI (SAS), etc. The host can further utilize an NVM Express (NVMe) interface to access the memory components 107-1, ..., 107-N when the memory sub-system 104 is coupled with the host by the PCIe interface.

FIG. 2 illustrates an example of a power management (PM) component 210. PM component 210 can be PM component 110 shown in FIG. 1. In this example, the PM component 210 can include the CVM 214, the PMIC 216, and the BPC 211, which can be used to manage various power requirements of the memory sub-system 104, memory components 107-1, ..., 107-N, and/or other electronic devices coupled thereto.

For example, the PMIC 216 can be configured to operate according to one or more configuration profiles, which can control altering a voltage received from the CVM 214 to provide one or more voltages to various memory components 107 of the memory sub-system 104. Such configuration profiles can include (e.g., store) instructions, parameters, etc., to be implemented using one or more of the regulators of the voltage convertor 225 described in further detail herein for conversion of a voltage received from the CVM 214 to a voltage compatible with operation of memory components 107 (e.g., reduced from 4V to 1V).

In a number of embodiments, a particular configuration profile of the PMIC 216 can be selected based on information about system power requirements. Such information can be received, for example, from a host (not shown) coupled to the memory sub-system 104 and/or the controller 105 of the memory sub-system 104. Non-limiting examples of system power requirements can include operating voltages for the controller 105/processor 106, functionalities of the PM component 210, and/or the memory components 107, including arrays of memory cells, sensing circuitry, ASICs, state machines, etc., control signals such as voltage signals, control logic, timing signals, and/or other control signals that correspond to particular configuration profiles, power mode (e.g., sleep mode) sequencing, master/slave configurations, serial ATA (SATA) input voltages, peripheral interconnect express (PCIe) input voltages, power backup operations, timing characteristics, operational characteristics, etc. Some system power requirements can be controlled by the controller 105, the processing device 106 thereof, the CVM 214, the PMIC 216, and/or the BPC 211 of the PM component 210 based on configuration profiles that are provided by (e.g., stored on) the CVM 214 and/or the PMIC 216.

The CVM 214 of the PM component 210 can store multiple configuration profiles that can be dynamically selected based on various requirements resulting from changes to a magnitude of the primary supply voltage 202 input from the PPS 201 to the memory sub-system 104 via the CVM 214. As used herein, a "configuration profile" generally refers to a protocol, a set of operating voltages, master/salve configuration, power backup state, specification, or other information corresponding to operation of a host or another component, such as a memory sub-system 104 (e.g., an SSD), a video card, an audio card, or other computer component 107, such as one or more arrays of memory cells, sensing circuitry for the arrays, etc. For example, aspects of the present disclosure include the PM component 210 (e.g., the BPC 211, the CVM 214, and/or the PMIC 216 of the PM component 210) having memory, such as NVM, disposed thereon. Such memory for the CVM 214 is shown in FIG. 2, for example, at 220 as a PMIC power control component (PPCC) and at 221 as a backup power control component (BPCC).

For example, the memory of the CVM 214 can be configured to store multiple selectable configuration profiles that can correspond to multiple different profiles for connection of the multiple capacitors 222 of the CVM 214 and/or for access (e.g., input 213) of the BPS from the BPC 211. A particular profile of the multiple different profiles to implement for connection of the multiple capacitors 222 can be selected dependent upon the magnitude of the primary supply voltage 202 input (e.g., via the connector/interface 103) from the PPS 201 to the CVM 214. For example, input of a primary supply voltage 202 above a range of voltages compatible with operation of the PMIC 216 can result in selection of a particular profile stored on the PPCC 220 of the CVM 214 that includes instructions to enable connection of a certain number of the multiple capacitors 222 so as to provide a reduced output voltage 215 (e.g., the first MPSV) compatible with operation of the PMIC 216. Any number of the multiple capacitors 222 can have the same capacitance and/or different capacitances.

Alternatively, input of a primary supply voltage 202 below a threshold can result in selection of a profile to access the BPC 211 (e.g., one or more batteries and/or capacitors thereof) so as to provide backup voltage 213 compatible with operation of the CVM 214 to output the first MPSV 215 to the PMIC 216. Being below the threshold can, in a number of embodiments, be the primary supply voltage 202 being below the range of voltages compatible with operation of the PMIC 216 and/or a voltage indicative of an interrupted connection to the PPS 201. For example, input of a primary supply voltage 202 below the range of voltages compatible with operation of the PMIC 216 can result in selection of a particular profile stored on the BPCC 221 of the CVM 214 to enable access to the backup voltage 213 of the BPC 211. The CVM 214 can be configured to reduce the backup voltage 213 output from the BPC 211 to provide an output voltage 215 (e.g., the first MPSV) compatible with operation of the PMIC 216.

Implementation of the CVM 214 described herein can enable use of components of the PMIC 216 (e.g., components of the voltage converter 225) designed for and/or compatible with operation within a limited range of PMIC supply voltages, where the range of voltages of the primary supply voltage 202 input to the CVM 214 can be broader and/or higher than the range of the PMIC supply voltages. For example, the range of PMIC supply voltages can be 3-5V, whereas the range of voltages input to the CVM 214 can be 12V to 240V or more. Accordingly, PMIC components designed to operate within a limited range of PMIC supply voltages can be utilized for PM components 210 without being reprogrammed and/or reconfigured based upon a particular input primary supply voltage 202 of a particular memory sub-system 104 that is above the range with which the PMIC component is compatible. Hence, utilizing the PMIC components designed as such for PM component 210 can reduce a number of the PMIC components designed as such from being wasted in stockpiles. Implementation of the CVM 214 described herein also can reduce use of PMIC components designed for a broader range of PMIC supply voltages and/or designed to perform a larger voltage reduction (e.g., from 12V to 1V rather than from 4V to 1V). Such one-stage voltage reductions using a single voltage converter of a PMIC component can be less energy efficient than the two-stage reduction using the CVM 214 described herein in combination with a voltage converter component 225 of the PMIC 216 configured to perform a smaller voltage reduction (e.g., from 5–3V to 1V).

In a number of embodiments, a particular profile stored on the BPCC 221 of the CVM 214 can be selected to provide an increased voltage 212 (e.g., the second MPSV) to be output from the CVM 214 to charge the BPC 211. This protocol can include instructions to enable connection a certain number of the multiple capacitors 222 so as to provide an appropriately increased output voltage 212 (e.g., the second MPSV) to charge the BPC 211.

Embodiments of a PMIC 216 consistent with this disclosure can include one or more components configured to provide multiple levels of electrical power (e.g., voltages) that are compatible with operation of memory components 107, among others, of the memory sub-system 104. The PMIC 216 can, in a number of embodiments, include a voltage detector 233 and a voltage converter component 225. The embodiment of the PMIC 216 illustrated in FIG. 2 is shown by way of example and embodiments are not limited as such. Hence, a PMIC consistent with this disclosure can include more or less components than are shown in FIG. 2.

The voltage detector 233 can detect whether the first MPSV 215 exceeds a range of voltages compatible with operation of the PMIC 216. The voltage detector 233 can generate a power-off signal 224 based on a result of detection of such a first MPSV 215. The power-off signal 224 can, in a number of embodiments, be sent to enable a disconnect of the PPS 201, the connector/interface 103, and/or the CVM 214 from supplying such a first MPSV 215. The voltage detector 233 can include a comparator that compares the first MPSV 215 to a reference voltage and outputs the power-off signal 224 as a result of the comparison. For example, when an uppermost voltage (e.g., first MPSV 215) compatible with operation of the PMIC 216 is 5V, the reference voltage can be set to 5V. A range of first MPSVs 215 and a corresponding reference voltage can, in a number of embodiments, be set to various voltage magnitudes. The comparator can, in some embodiments, generate the power-off signal 224 at a logic high level when the first MPSV 215 is higher than a first reference voltage and can generate the power-off signal 224 at a logic low level when the first MPSV 215 is lower than a second reference voltage. The first reference voltage can, for example, be higher than the second reference voltage.

The voltage converter component 225 can convert the first MPSV 215 into a further reduced voltage 230 compatible with operation of the memory components 107 described herein. The first MPSV 215 can be a reduced voltage relative to a voltage that was originally provided to the CVM 214 from the PPS 201 or the BPC 211. The voltage converter component 225 can include a low-dropout (LDO) regulator 226, a buck-boost converter 227, a buck regulator 228, and/or a boost regulator 229.

The LDO regulator 226 can be a linear voltage regulator that operates with a very small input-output differential voltage that can regulate an output voltage of the buck-boost converter 227 to output the further reduced voltage 230. Multiple LDO regulators 226 can be provided based on the number of further reduced voltages 230 that are used in the memory sub-system 104 of FIG. 1.

The buck-boost converter 227 can detect the first MPSV 215 and can operate in a buck-mode when the first MPSV 215 is higher than an intended further reduced voltage 230 to be output from the buck-boost converter 227. The buck-boost converter 227 can operate in a boost-mode when the detected first MPSV 215 is lower than an intended voltage to be output from the buck-boost converter 227. The buck-boost converter 227 can contribute to output of a constant voltage in a number of embodiments.

The buck regulator 228 can be a voltage reduction-type direct current (DC)/DC converter that can generate a predetermined output voltage by reducing an input voltage (e.g., reducing the first MPSV 215 to the further reduced voltage 230). The buck regulator 228 can use a switching device that is turned on/off in a certain period and can have a structure in which an input power supply (e.g., the first MPSV 215) is connected to a circuit while the switch is turned on and is not connected to the circuit while the switch is turned off. The buck regulator 228 can output a DC voltage by averaging, through an inductor-capacitor (LC) filter, a voltage having a pulse shape that is periodically connected to or disconnected from a circuit in this manner. The buck regulator 228 can use a principle of generating an output voltage by averaging a pulse voltage by periodically chopping a DC voltage such that the output voltage of the buck regulator 228 (e.g., the further reduced voltage 230) can have a voltage that is less than an input voltage (e.g., the first MPSV 215) of the buck regulator 228.

The boost regulator 229 can be a voltage boost-type DC/DC converter. In the boost regulator 229, when a switch is turned on, the first MPSV 215 can be connected to two terminals of an inductor to form a charge current. When the switch is turned off, the charge current can be transferred to a load. Accordingly, the amount of current of an output terminal of the boost regulator 229 can be less than that of an input terminal of the boost regulator 229. Since there is no loss due to an operation principle of the boost regulator 229, an output voltage of the boost regulator 229 can be higher than an input voltage (e.g., the first MPSV 215) of the boost regulator 229, based on an "input current*input voltage=output current*output voltage" relationship.

The CVM 214 can be coupled to the PMIC 216 and can be configured to decrease a primary supply voltage 202, received from the PPS 201, to the first MPSV 215. The decrease can be selectably determined to provide the PMIC 216 with a supply voltage that is lower than the primary supply voltage 202 and that is compatible with operation of the PMIC 216. The CVM 214 also can be coupled to the BPC 211 and can be configured to increase the primary supply voltage 202 received from the PPS 201. The increase can be selectably determined, based at least partially on, a characteristic of the BPC 211 (e.g., of the one or more rechargeable batteries and/or capacitors thereof) coupled via the CVM 214 to the PMIC 216.

The CVM 214 can be configured to, based on a status of the primary supply voltage 202 being monitored by a monitoring unit 219 that is part of the CVM 214, provide signals to select between multiple different connections of the multiple capacitors 222 of the CVM 214. Responsive to a determination by the monitoring unit 219 that the primary supply voltage 202 is above a range of voltages compatible with operation of the PMIC 216, the monitoring unit 219 can send a signal to the PPCC 220 that is part of the CVM 214. The PPCC 220 can, in a number of embodiments, be configured to determine a particular number of (e.g., which of) the multiple capacitors 222 of the CVM 214 to connect to reduce a particular voltage magnitude of the primary supply voltage 202 to the first MPSV 215 compatible with operation of the PMIC 216, direct the CVM 214 to connect the particular number of the multiple capacitors 222, and direct the CVM 214 to output the first MPSV 215 to the PMIC 216.

Prior to a determination by the monitoring unit 219 that the PPS 201 provides a primary supply voltage 202 that is lower than a threshold voltage compatible with operation of the memory sub-system 104 and/or the PMIC 216, the CVM 214 (e.g., the monitoring unit 219 thereof) can be configured to send a signal to the BPCC 221. The first MPSV 215 and the second MPSV 212 can each have different voltage magnitudes. For example, in some embodiments, the first MPSV 215 can be 4V and the second MPSV 212 can be 36V, although embodiments are not so limited. The BPCC 221 can be configured to direct the CVM 214 to increase the primary supply voltage 202 for storage by the BPC 211, direct a particular number of (e.g., which of) the multiple capacitors 222 of the CVM 214 to connect to increase the primary supply voltage 202 to an increased primary supply voltage. A magnitude of the increased primary supply voltage can be based at least partially on, a characteristic of the BPC 211 (e.g., of the one or more rechargeable batteries and/or capacitors thereof). The BPCC 221 can be further configured to direct output of the increased primary supply voltage (e.g., the second MPSV 212) from the CVM 214 to the BPC 211 for storage by the BPC 211.

Responsive to a determination by the monitoring unit 219 that the primary supply voltage 202 is lower than a threshold voltage for operation of the memory sub-system 104 and/or the PMIC 216, the monitoring unit 219 can be configured to send a signal to the BPCC 221 to provide a backup voltage 213 from the BPC 211 to the CVM 214. Responsive to a signal from the BPCC 221, the CVM 214 can receive the backup voltage 213 from the BPC 211. As described herein, the magnitude of the backup voltage 213 is not lower than the primary supply voltage 202. For example, the magnitude of the backup voltage 213 can, in a number of embodiments, be higher than the primary supply voltage 202. The CVM 214 can produce a decreased backup voltage for output to the PMIC 216, and the PMIC 216 can convert the decreased backup voltage into a reduced voltage compatible with operation of a memory component 107. The primary supply voltage 202 being lower than the threshold voltage can be based on a reduction in the magnitude of the primary supply voltage 202 and/or on interruption of a connection to the PPS 201, among other possible causes for a decrease in the primary supply voltage 202.

Responsive to the signal from the monitoring unit 219, the BPCC 221 of the CVM 214 can be configured to determine a particular number of (e.g., which of) the multiple capacitors 222 of the CVM 214 to connect to reduce the backup voltage, received from the BPC 211, to the decreased backup voltage. The BPCC 221 can direct the CVM 214 to connect the particular number of the multiple capacitors 222 and direct the CVM 214 to output the decreased backup voltage to the PMIC 216. For example, the backup voltage stored by the BPC 211 (e.g., by being charged via the second MPSV 212 received from the CVM 214) can be 36V and the BPCC 221 can, in a number of embodiments, determine that a particular number of the multiple capacitors can be serially connected to output one ninth (36÷9=4) of the backup voltage to the PMIC 216.

Responsive to the determination by the monitoring unit 219 that the primary supply voltage 202 is lower than the threshold voltage, the connector/interface 103 to the PPS 201 can be configured to disconnect the memory sub-system 104 from the PPS 201. In a number of embodiments, the monitoring unit 219 can send a signal to direct the connector/interface 103 to disconnect the memory sub-system 104 from the PPS 201. The BPCC 221 can direct the CVM 214 to receive the backup voltage from the BPC 211 to enable performance of a number of operations by one or more of the memory components 107-1, . . . , 107-N. Such operations can, in a number of embodiments, include data values stored by a memory component 107 being moved from the memory component 107 for storage by a number of NVM cells. For example, at least some data values can be stored on VM components (e.g., on one or more arrays of DRAM cells, among other possible types of VM) and these data values can be lost by not being stored when the primary supply voltage 202 is lower than the threshold voltage.

To reduce (e.g., prevent) the potential for loss of data values as such, the data values can be moved from the VM components for storage on NVM cells of NVM components. The NVM components can, in a number of embodiments, be one or more arrays of NAND flash cells, among other possible types of NVM. The VM components can be located (e.g., formed) on the memory sub-system 104 (e.g., the SSD shown in FIG. 1). The NVM components can, in a number of embodiments, either be located (e.g., formed) on the memory sub-system 104 or on another memory sub-system (not shown). Receiving the backup voltage from the BPC 211 and/or reducing the backup voltage to voltages compatible with operation of the PMIC 216 and/or the memory components 107 can enable performance of the one or more operations by the memory components 107, including the movement to reduce the potential for loss of the data values.

Figure 3:
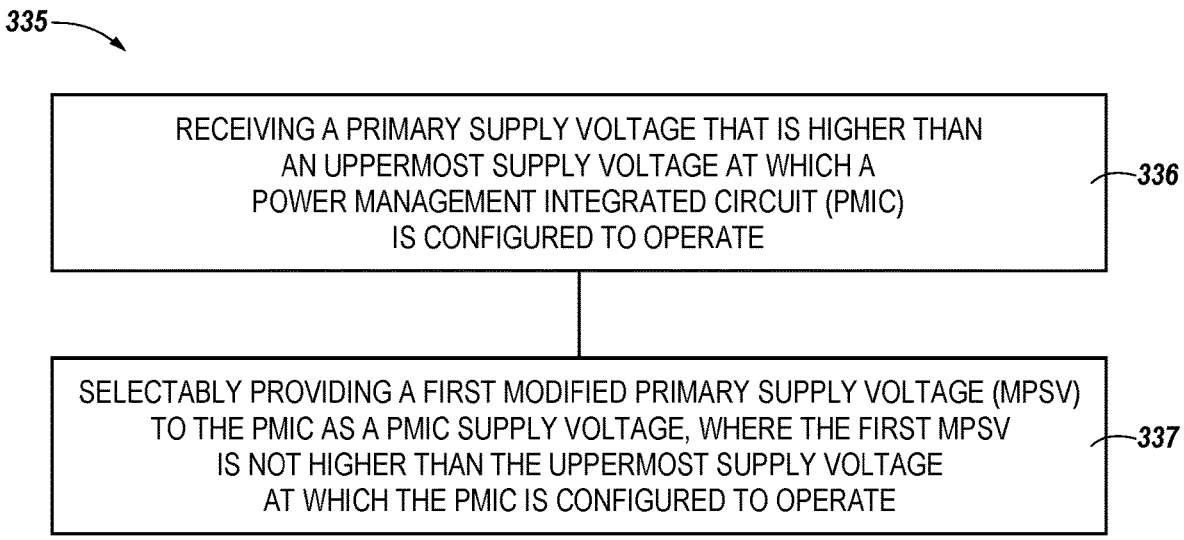
FIG. 3 is a flow diagram of an example method to operate a capacitive voltage modifier in accordance with some embodiments of the present disclosure.

FIG. 3 is a flow diagram of an example method 335 to operate a CVM, as shown at 114 in FIG. 1 and at 214 in FIG. 2, in accordance with some embodiments of the present disclosure. The method 335 can be performed by processing logic that can include hardware, software (e.g., instructions run or executed on a processing device), or a combination thereof. Such hardware can, in a number of embodiments, include one or more of a processing device, circuitry, dedicated logic, programmable logic, microcode, hardware of a device, integrated circuit, etc.

In a number of embodiments, the method 335 can be performed by one or more components of the controller 105, the processor 106, and/or the PM component shown at 110 and described in connection with FIG. 1 and/or shown at 210 and described in connection with FIG. 2. Although shown in a particular sequence or order, unless otherwise specified, the order of the processes in the method 335 can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 336, the processing device receives a determination of a magnitude of the primary supply voltage 202. The primary supply voltage 202 can be higher than an uppermost supply voltage at which the PMIC 216 is configured to operate. The primary supply voltage 202 can, in a number of embodiments, be input to the CVM 214 on the memory sub-system 104 (e.g., SSD). The magnitude of the primary supply voltage 202 can, in a number of embodiments, be determined by a voltage detector (not shown) formed as part of the monitoring unit 219 that is part of the CVM 214, as part of the connector/interface 103, the controller 105, and/or the processor 106, or elsewhere on the memory sub-system 104. The CVM 214 can be coupled to a PMIC 216 of the memory sub-system 104.

At block 337, the processing device selectably provides (e.g., by the CVM 214) a first MPSV 215 to the PMIC 216 as a PMIC supply voltage. In a number of embodiments, the first MPSV 215 is not higher than the uppermost supply voltage at which the PMIC 216 is configured to operate.

In a number of embodiments, the processing device can selectably provide (e.g., by the CVM 214) a second MPSV 212 to a BPC 211 of the memory sub-system 104. In a number of embodiments, the second MPSV is not lower than the primary supply voltage 202. The second MPSV 212 can be utilized for charging the BPC 211.

In a number of embodiments, the processing device directs selectably reducing the first MPSV 215, using a voltage converter component 225 of the PMIC 216, to a further reduced voltage compatible with operation of a selected memory component 107 of the memory sub-system 104. In a number of embodiments, the processing device directs the BPC 211 to be charged via the second MPSV 212 to enable performance of an operation on a memory component 107 of the memory sub-system 104 responsive to a reduced primary supply voltage 202.

In a number of embodiments, the processing device of the memory sub-system 104 can be configured to receive instructions, from a host separate from the memory sub-system 104, for performance of an operation on the selected memory component 107 of the SSD. The processing device of the memory sub-system 104 can be further configured to direct performance of the operation. The operation can be selectably performed by a PPCC 220 of the CVM 214 directing the CVM 214 to perform an adjustment on the primary supply voltage 202 to cause the first MPSV 215 to be within a predetermined range of voltages compatible with operation of the PMIC 216 and/or by a BPCC 221 of the CVM 221 directing the CVM 214 to perform an adjustment on a backup voltage received from the BPC 211 to cause a reduced backup voltage to be within a predetermined range of voltages compatible with operation of the PMIC 216.

FIG. 4 is an additional flow diagram 440 of the example method 350 illustrated in FIG. 3 in accordance with some embodiments of the present disclosure. At block 441, the processing device directs output of a backup voltage from the BPC 211 to the CVM 214 responsive to detection of a reduced primary supply voltage 202. At block 442, the processing device directs performance, by the CVM 214, of a coarse adjustment on the backup voltage to cause a reduced backup voltage to be within a predetermined range of voltages compatible with operation of the PMIC 216. At block 443, the processing device directs performance, by the PMIC 216, of a fine adjustment on the reduced backup voltage received from the CVM 214 to cause a further reduced voltage to be within a predetermined range of voltages compatible with performance of an operation on a selected memory component 107 (e.g., an array of memory cells) on the memory sub-system 104.

At block 444, the performance of the coarse adjustment can include the predetermined range of voltages compatible with operation of the PMIC 216 being wider than the predetermined range of voltages compatible with operation of the selected array that is caused by the fine adjustment. For example, the coarse adjustment can cause a backup voltage of 36V to be reduced by the CVM 214 to the reduced backup voltage (e.g., the first MPSV 215) having a 3-5V range compatible with operation of the PMIC 216, whereas the fine adjustment performed by the PMIC 216 can cause the further reduced voltage to be within a 0.5-1.5V range compatible with operation of the selected array. The coarse adjustment just described can, in a number of embodiments, be performed on a primary supply voltage 202 that is not reduced below a threshold voltage to provide the first MPSV 215 having the 3-5V range. For example, the coarse adjustment can be performed on a primary supply voltage 202 with a magnitude of 12V that is within a normal operating range of input voltages.

At block 445, the performance of the fine adjustment can include the values of the further reduced voltages that are compatible with performance of the number of operations on the selected array being less than the values of the reduced backup voltages (or the first MPSV 215) that are compatible with operation of the PMIC 216. For example, the magnitude of the voltages in the 0.5-1.5V range compatible with operation of the selected array is less than the magnitude of the voltages in the 3-5V range compatible with operation of the PMIC 216.

Figure 5:
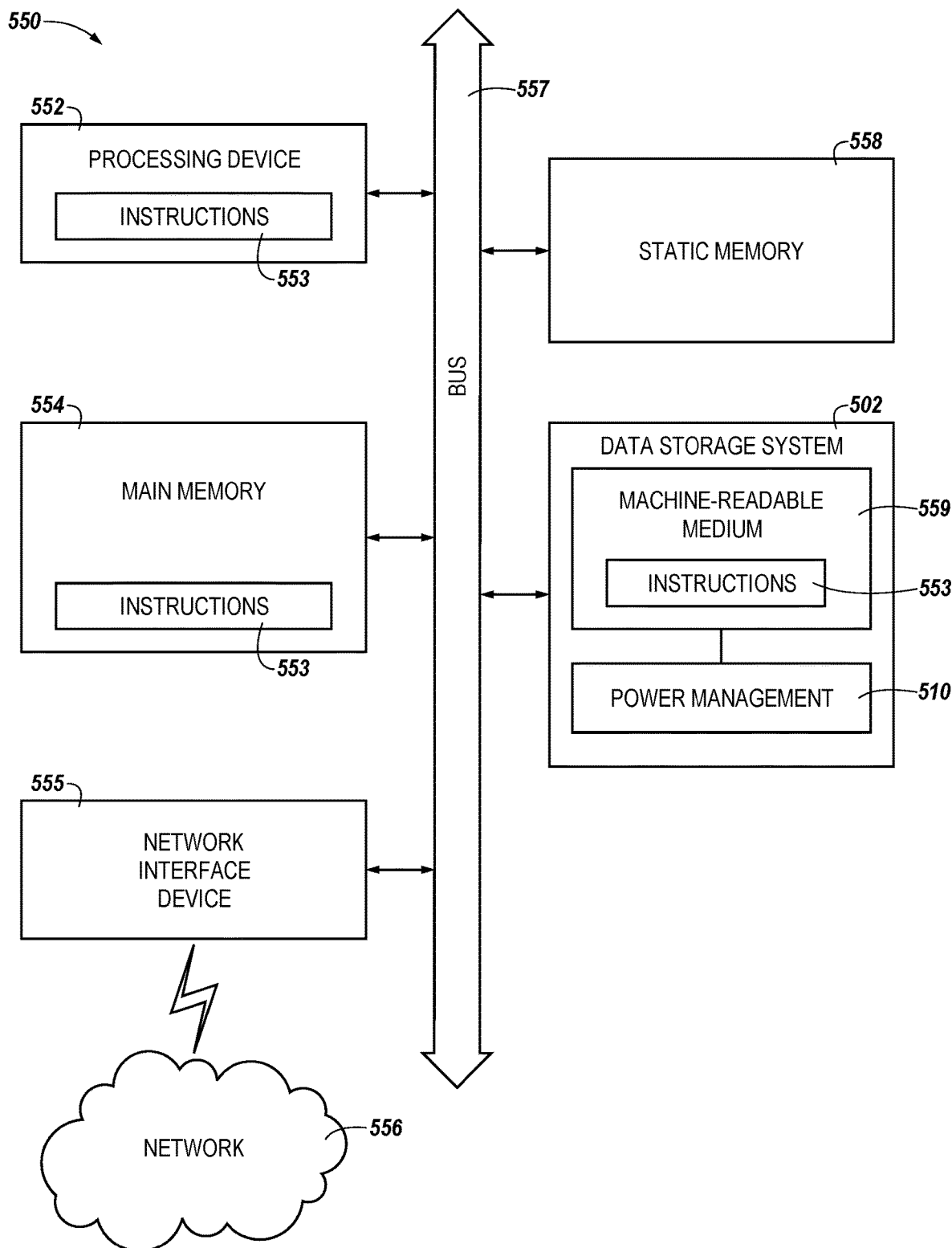
FIG. 5 is a block diagram of an example computer system in which embodiments of the present disclosure may operate.

FIG. 5 illustrates an example machine of a computer system 550 within which a set of instructions, for causing the machine to perform any one or more of the methodologies discussed herein, can be executed. In some embodiments, the computer system 550 can correspond to a host system (e.g., the host system described in connection with FIG. 1) that includes, is coupled to, and/or utilizes a memory sub-system such as the memory device/SSD 104 of FIG. 1. The computer system 550 can be used to execute operations of a controller 105 and/or processor 106 on an operating system to perform operations, including the operations performed by the PM component 110 of FIG. 1 and/or the PM component 210 of FIG. 2). In a number of embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 550 includes a processing device 552, a main memory 554, a static memory 558, and a data storage system 502, which communicate with each other via a bus 557. The main memory 554 can, in a number of embodiments, be read-only memory (ROM), flash memory, dynamic random access memory (DRAM), such as synchronous DRAM (SDRAM) or Rambus DRAM (RDRAM), among other possibilities. The static memory 558 can, in a number of embodiments, be flash memory, static random access memory (SRAM), among other possibilities. The data storage system 502 can correspond to the memory sub-system 104, the memory device, and 104 described in connection with FIG. 1.

Processing device 552 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 552 can also be one or more special-purpose processing devices such as an application specific integrated circuit (ASIC), a field programmable gate array (FPGA), a digital signal processor (DSP), network processor, or the like. The processing device 552 is configured to execute instructions 553 for performing the operations and steps discussed herein. The computer system 550 can further include a network interface device 555 to communicate over a network 556.

The data storage system 502 can include a machine-readable storage medium 559 (also known as a computer-readable medium) on which is stored one or more sets of instructions 553 or software embodying any one or more of the methodologies or functions described herein. The instructions 553 also can reside, completely or at least partially, within the main memory 554 and/or within the processing device 552 during execution thereof by the computer system 550. The main memory 554 and the processing device 552 also contribute to the machine-readable storage media. The machine-readable storage medium 559, data storage system 502, and/or main memory 554 can correspond to the memory sub-system 104 of FIG. 1.

In a number of embodiments, the instructions 553 can include instructions to implement functionalities corresponding to a power management component. The functionalities can, for example, correspond to the functionalities of the PM component 210 of FIG. 2, including the BPC 211, the CVM 214, and the PMIC 216, among others. While the machine-readable storage medium 559 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that can cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data values (bits) within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description herein. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable storage medium, such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
  a capacitive voltage modifier (CVM) coupled to a power management integrated circuit (PMIC), the CVM configured to:
    modify, in response to receipt of a primary supply voltage of the memory sub-system, the primary supply voltage to generate a first modified primary supply voltage (MPSV); and
    provide the first MPSV to the PMIC as a PMIC supply voltage;
  wherein:
    the CVM is configured to modify the primary supply voltage via a plurality of series-coupled capacitors; and
    a quantity of the plurality of series-coupled capacitors to be utilized for the modification depends on an amount that the primary supply voltage is to be modified.

2. The memory sub-system of claim 1, wherein the CVM is configured to reduce, responsive to the primary supply voltage higher than an uppermost PMIC supply voltage at which the PMIC is compatible with operation, the primary supply voltage to generate the first MPSV that is not higher than the uppermost PMIC supply voltage.

3. The memory sub-system of claim 1, further comprising a backup power component (BPC) coupled to the CVM, the BPC configured to operate as a backup power supply of the memory sub-system, and wherein:
  the CVM is further configured to modify the primary supply voltage to generate a second MPSV; and
  provide, to charge the BPC, the second MPSV to the BPC.

4. The memory sub-system of claim 1, wherein the CVM is configured to:
  receive the primary supply voltage from a primary power supply (PPS); and
  monitor a voltage magnitude of the primary supply voltage to determine whether to modify the primary supply voltage.

5. A method, comprising:
  receiving, at a capacitive voltage modifier (CVM), a primary supply voltage from a primary power supply (PPS) coupled to a memory sub-system; and
  decreasing, by the CVM, the primary supply voltage to provide a power management integrated circuit (PMIC) supply voltage that is lower than the primary supply voltage and compatible with operation of the PMIC;
  wherein the method further comprises:
    monitoring, by the CVM, a voltage magnitude of the primary supply voltage received from the PPS; and
    accessing, responsive to the primary supply voltage being lower than a range of voltages compatible with operation of the PMIC, a backup power component (BPC) coupled to the CVM to receive a backup voltage from the BPC.

6. The method of claim 5, further comprising increasing, by the CVM, the primary supply voltage received from the PPS, wherein the increase is selectable determined, based at least partially on, a characteristic of a backup power component (BPC) coupled via the CVM to the PMIC.

7. The method of claim 5, further comprising decreasing the primary supply voltage by using a number of capacitors of the CVM.

8. A system, comprising:
  a plurality of memory sub-system components; and
  a capacitive voltage modifier (CVM) configured to:
    modify, in response to receipt of a primary supply voltage, the primary supply voltage to generate a first modified primary supply voltage (MPSV) and a second MPSV, wherein the first MPSV and the second MPSV each have different voltage magnitudes; and
    provide the first MPSV to a first one of the plurality of memory sub-system components and the second MPSV to a second one of the plurality of memory sub-system components.

9. The system of claim 8, wherein the first one of the plurality of memory sub-system components is a power management integrated circuit (PMIC) compatible with operation at an uppermost PMIC supply voltage, and wherein the CVM is configured to:
  responsive to the uppermost PMIC supply voltage being lower than the primary supply voltage, decrease the primary supply voltage to generate the first MPSV that is lower than the uppermost PMIC supply voltage.

10. The system of claim 9, wherein the second one of the plurality of memory sub-system components is a backup power component (BPC), and wherein the CVM is configured to:

access, responsive to the primary supply voltage received from a primary power supply (PPS) being lower than a range of voltages compatible with operation of the PMIC, to the BPC; and receive, responsive to the access to the BPC, a backup voltage from the BPC to generate the first MPSV based at least partially on the backup voltage.

11. The system of claim 10, wherein the CVM is configured to reduce the received backup voltage to provide the first MPSV compatible with operation of the PMIC.

12. The system of claim 10, wherein the backup voltage stored by the BPC is generated by being charged via the second MPSV previously provided from the CVM.

13. The system of claim 10, wherein the CVM is coupled to the PPS via an interface, and wherein the interface is configured to disconnect CVM from the PPS responsive to the primary supply voltage received from the PPS being lower than the range of voltages compatible with the operation of the PMIC.

14. The system of claim 8, wherein the second one of the plurality of memory sub-system components is a backup power component (BPC), and wherein the CVM is configured to increase the primary supply voltage such that the second MPSV is not lower than the primary supply voltage.

15. The system of claim 8, wherein the system is a solid-state drive (SSD).

16. A memory sub-system, comprising:
a capacitive voltage modifier (CVM) coupled to a power management integrated circuit (PMIC), the CVM configured to:
  modify, in response to receipt of a primary supply voltage of the memory sub-system, the primary supply voltage to generate a first modified primary supply voltage (MPSV); and
  provide the first MPSV to the PMIC as a PMIC supply voltage;
wherein the memory sub-system further comprises a backup power component (BPC) coupled to the CVM, the BPC configured to operate as a backup power supply of the memory sub-system, and wherein:
  the CVM is further configured to modify the primary supply voltage to generate a second MPSV; and
  provide, to charge the BPC, the second MPSV to the BPC.

17. The memory sub-system of claim 16, wherein the CVM is configured to:
modify, to generate the second MPSV, the primary supply voltage via a plurality of parallel-coupled capacitors; and
wherein a quantity of the plurality of parallel-coupled capacitors to be utilized for the modification depends on an amount that the primary supply voltage is to be modified.

18. The memory sub-system of claim 16, wherein the CVM is configured to amplify, responsive to the primary supply voltage having a magnitude lower than a threshold that is compatible with charging the BPC, the primary supply voltage to generate the second MPSV that is not lower than the threshold.

19. A method, comprising:
receiving, at a capacitive voltage modifier (CVM), a primary supply voltage from a primary power supply (PPS) coupled to a memory sub-system; and
decreasing, by the CVM, the primary supply voltage to provide a power management integrated circuit (PMIC) supply voltage that is lower than the primary supply voltage and compatible with operation of the PMIC;
wherein the method further comprises decreasing the primary supply voltage by using a number of capacitors of the CVM.

20. A memory sub-system, comprising:
a capacitive voltage modifier (CVM) coupled to a power management integrated circuit (PMIC), the CVM configured to:
  modify, in response to receipt of a primary supply voltage of the memory sub-system, the primary supply voltage to generate a first modified primary supply voltage (MPSV); and
  provide the first MPSV to the PMIC as a PMIC supply voltage;
wherein the CVM is configured to:
  receive the primary supply voltage from a primary power supply (PPS); and
  monitor a voltage magnitude of the primary supply voltage to determine whether to modify the primary supply voltage.

21. A method, comprising:
receiving, at a capacitive voltage modifier (CVM), a primary supply voltage from a primary power supply (PPS) coupled to a memory sub-system; and
decreasing, by the CVM, the primary supply voltage to provide a power management integrated circuit (PMIC) supply voltage that is lower than the primary supply voltage and compatible with operation of the PMIC;
wherein the method further comprises increasing, by the CVM, the primary supply voltage received from the PPS, wherein the increase is selectable determined, based at least partially on, a characteristic of a backup power component (BPC) coupled via the CVM to the PMIC.

22. The method of claim 19, further comprising:
monitoring, by the CVM, a voltage magnitude of the primary supply voltage;
determining, responsive to the primary supply voltage being monitored to be higher than a range of voltages compatible with operation of the PMIC, a quantity of the number of capacitors to be used for decreasing the primary supply voltage; and
decreasing the primary supply voltage using the determined quantity of the number of capacitors.

* * * * *